United States Patent
Destefanis et al.

(10) Patent No.: US 6,188,070 B1
(45) Date of Patent: Feb. 13, 2001

(54) PHOTONIC RADIATION SENSOR OF LARGE DIMENSIONS

(75) Inventors: Gérard Destefanis, Saint Egreve; Michel Wolny, Grenoble, both of (FR)

(73) Assignee: Commissariat a l'Energie Atomique, Paris (FR)

(*) Notice: Under 35 U.S.C. 154(b), the term of this patent shall be extended for 0 days.

(21) Appl. No.: 09/077,225

(22) PCT Filed: Sep. 29, 1997

(86) PCT No.: PCT/FR97/01714

§ 371 Date: Dec. 28, 1998

§ 102(e) Date: Dec. 28, 1998

(87) PCT Pub. No.: WO98/15016

PCT Pub. Date: Apr. 9, 1998

(30) Foreign Application Priority Data

Oct. 1, 1996 (FR) .................................... 96 11937

(51) Int. Cl.[7] .................................................. H01L 25/065
(52) U.S. Cl. ................ 250/370.08; 250/352; 250/370.09
(58) Field of Search .............................. 250/352, 370.08, 250/370.09

(56) References Cited

U.S. PATENT DOCUMENTS 5,512,750 * 4/1996 Yanka et al. ..................... 250/370.08

FOREIGN PATENT DOCUMENTS 2612335  9/1988 (FR) .

OTHER PUBLICATIONS

Kwak N J et al: "HGO8CD0.2TE Grown by Liquid Phase Epitaxy Using CD0.94ZN0.06TE Buffer Layer" Journal of Crystal Growth, vol. 138, No. 1/04, Apr. 2, 1994, pp. 950–955, XP000474560.

Bubulac L O et al: "Diffusion of AS and SB in HGCDTE" Journal of Crystal Growth, vol. 123, No. 3/04, Oct. 1, 1992, pp. 555–566, XP000328229.

Destefanis G L: "HGCDTE Infrared Diode Arrays" Semiconductor Science and Technology, vol. 6, No. 12C, Dec. 1, 1991, pp. C88–C92, XP000247934.

Kawahara A et al: "Hybrid 256*256 LWIR FPA using MBE grown HgCdTe on GaAs" Infrared Technology XXI, San Diego, CA, USA, Jul. 9–13, 1995, vol. 2552, pt. 1, ISSN 0277-786X, Proceedings of the SPIE–The International Society for Optical Engineering, 1995, SPIE–Int. Soc. Opt. Eng, USA, pp. 411–420, XP000646077.

Harman: "Controlled p–type Sb doping in LPE grown Hg(1–x)Cd(x)Te epilayers." Journal of Electronic Materials, vol. 22, No. 9, 1993, pp. 1165–1172, XP000646076.

* cited by examiner

*Primary Examiner*—Constantine Hannaher
*Assistant Examiner*—Andrew Israel
(74) *Attorney, Agent, or Firm*—Pearne & Gordon LLP

(57) ABSTRACT

A two-dimensional photonic radiation detector based on a technique of hybridizing a detection chip onto a read chip through a micro-balls network making the electrical and mechanical inter-connection between two chips, the detection chip being composed of a two-dimensional structure of ixj pixels, an active layer (41) being epitaxed onto a substrate (40), each elementary photosensitive component consisting of an N/P or P/N diode formed in the active layer (41), the contact point on the N or P area being made at each pixel, the contact point on the other P or N area being common to all diodes, in which the detector includes a wide gap optically and electrically transparent intermediate layer (42) located between the active layer (41) and the substrate (40).

9 Claims, 2 Drawing Sheets

PHOTONIC RADIATION SENSOR OF LARGE DIMENSIONS

TECHNICAL FIELD

This invention relates to a large dimension photonic radiation detector.

STATE OF PRIOR ART

The most frequently used high performance infrared detectors at the present time are based on a technique of hybridizing a detection chip on a read chip through a network of micro-balls (for example based on indium) providing the electrical and mechanical interconnection between the two chips.

The read circuit that reads the signals detected by each pixel and multiplexes them on a single output or a small number of outputs, is an analogue silicon based circuit. The complexity of these circuits (size, density, analog nature) makes it impossible to reasonably consider any other technology for making them.

The detection chip is usually composed of a large number of pixels placed according to a two-dimensional or mosaic structure with ixj pixels (for example 128×128, 256×256, 640×680 pixels) or possibly according to a single-dimensional or quasi-single dimensional structure with ixj pixels where i=1 or I<<j (for example 288×4 or 480×4 pixels). In order to make high performance components, the most frequently used detection material at the present time is a $Cd_xHg_{1-x}Te$ alloy ($0 \leq x \leq 1$) epitaxed by any technique (LPE, MBE, MOVPE, ISOVPE, etc.) on an $Cd_{1-z}Zn_zTe$ substrate ($0 \leq z \leq 1$) adapted as mesh parameter. The elementary photosensitive component consists of an N/P diode formed in the CdHgTe layer.

There are several technological variants for making these junctions. The most mature technique at the present time is based on a planar process using an ionic implantation to form the junction as described in document references [1] or [2] at the end of this description. Note that if the contact point on the N area is at the level of each pixel, the contact point on the P area is usually common to all elementary diodes making up the device. This device offers many advantages compared with other technologies, mainly related to its relative simplicity that leads to a very good reproducibility/reliability; lack of etching to define active surfaces, simple metallurgical stacking (this structure requires a single layer, whereas at least two layers are necessary for hetero-junction structures) lower sensitivity of the detector to low frequency noise when the device is polarized. The robustness and reliability of this technology are demonstrated by the fact that components made in this way were the first to be industrially available. Furthermore, it was recently shown that the same dark current can be obtained in these structures in which an N material junction is formed on P material, as shown in FIGS. 1A and 1B and described in document reference [3], as is obtained in hetero-junction structures in which the P area is above the N area as shown in FIG. 2.

FIGS. 1A and 1B show a schematic view of a hybridized two-dimensional infra-red radiation detector on its read circuit and an enlargement of the pixel showing a section through a detection element, respectively.

FIG. 1A also shows a detecting chip 10, a silicon circuit 11, and metal connections (for example indium micro-balls). The video signal is obtained at 13.

FIG. 1B corresponds to a magnification of part reference 14 in FIG. 1A. This FIG. shows a CdZnTe substrate 20, an CdHgTe layer 21, an N/P diode 22 formed in this layer 21, a passivation layer 23, an anti-reflection layer 24, a contact 25, an indium micro-ball 12, a silicon circuit 27, the received radiation 28 being an infra-red illumination.

FIG. 2 illustrates a "P on N" hetero-junction detector comprising a CdZnTe substrate 30 on top of which there is a type N detecting layer 31 made of $Cd_xHg_{1-x}Te$, a P type detecting layer 32 made of $Cd_yHg_{1-y}Te$ where y>x, and a passivation layer 33. FIG. 2 also shows a pixel contact 34, and a "substrate" contact 35 common to all pixels located at the end of the mosaic.

At the present time there is an increasingly pressing need for two-dimensional circuits with a very large number of pixels, for example more than 256×256 elements. With these components, when an attempt is made to detect a strong signal, as is the case for example for a thermal camera mode operating in the 8–12 μm band and when observing a scene at a temperature of close to 300K, a depolarization phenomenon may be observed in the diodes located far from contact points, called "substrate contacts" in the rest of this description, usually located at the edge of the matrix and which are common to all pixels in the matrix as described above, particularly in N on P planar structures. This phenomenon can be very troublesome when attempting to make the device operate and can even make it unusable. It is related to the value of the access resistance to these diodes from the center of the component. In the case of N on P planar structures, this access resistance depends on the transport properties from the P area in the CdHgTe layer 21 (typical doping within the range of a few $10^{16}$ cm$^{-3}$, typical mobility of carriers (holes) within the range 300–500 cm$^2$/V/s), and obviously by the size of the component.

Some "obvious" solutions may be suggested to solve this problem. They include a substrate contact (i.e. in the case of planar structures on the P layer in the CdHgTe layer 21) close to each diode or each group of diodes, of sufficiently small size to prevent any depolarization problems. However, this implies a reduction in the mosaic filling factor and therefore a drop in its performance, either at each pixel or in each group of the pixels, and increased technological complexity (connections between all substrate contacts). Another solution is to increase the thickness of the CdHgTe layer 21 compared with the normally used layer (thickness $e_0$) and therefore the thickness of the P area that remains after ionic implantation of N areas, in the case of N on P planar structures. Once again the performance of the device is degraded; either the quantum efficiency reduces (for example if $e_0$ is greater than the diffusion wave length of minority carriers), or the dark current increases (if $e_0$ is less than the diffusion wave length of minority carriers), or both (if $e_0$ is less than the diffusion length of minority carriers and if the final thickness of the layer exceeds the diffusion length of minority carriers). In all cases the ratio between the photonic current and the dark current reduces.

This access resistance problem occurs at a much lower level in hetero-junction structures that use a P on N structure as shown in FIG. 2, and which benefit from excellent conducting properties of N type layers related to the very high mobility of electrons in these layers; in these structures, this N type layer forms the substrate contact common to all diodes. However, this technology has serious disadvantages compared with N on P "planar" technology.

The purpose of the invention is to overcome the high series resistance problem encountered on diodes made using the planar technology described above and located at the center of large two dimensional mosaics with ixj pixels (where i and j are large, for example greater than 128) designed to detect a high signal level while maintaining the electro-optical characteristics of detectors.

DISCLOSURE OF THE INVENTION

This invention relates to a large two-dimensional photonic radiation detector based on a technique of hybridizing a detection chip onto a read chip through a micro-balls network making the electrical and mechanical inter-connection between two chips, the detection chip being composed of a two-dimensional structure of ixj pixels, an active layer being epitaxed onto a substrate, each elementary photosensitive component consisting of an N/P or P/N diode formed in the active layer, the contact point on the N or P area being made at each pixel, the contact point on the other P or N area being common to all diodes, characterized in that it comprises a wide gap (or prohibited band width) optically and electrically transparent intermediate layer located between the active layer and the substrate.

Beneficially, the active layer is a layer of $Cd_xHg_{1-x}Te$, where $0 \leq x \leq 1$, the substrate is a layer of $Cd_{1-z}Zn_zTe$, where $0 \leq z \leq 1$, and the intermediate layer is a layer of $Cd_yHg_{1-y}Te$, transparent for the wave lengths to be detected: $x+\epsilon<y<1$, where $\epsilon>0$ and x is the composition of the layer of $Cd_xHg_{1-x}Te$ making up the active layer. We can choose $x_{max}<Y$, where $x_{max}$ would be the composition of a CdHgTe layer with a gap equal to $hc/q\lambda_{min}$ (h=Planck's constant, c=speed of light, q=electron charge, $\lambda_{min}$=minimum wave length to be detected), the maximum wave length to be detected being defined by the gap in the layer of $Cd_xHg_{1-x}Te$. Furthermore, y is preferentially chosen to be less than $x_{max}+0.1$ in order to maintain an excellent match in the meshes between the substrate, the intermediate layer and the rest of the structure (optically active area).

Beneficially, the thickness of the intermediate layer is between 10 and 30 $\mu$m.

In a first variant of the invention, this layer is doped to differ from stoichiometry.

In a second variant, this layer is extrinsically P type doped with an impurity. Preferably, an impurity that does not diffuse much in CdHgTe, for example As or Sb, is used.

This invention has applications in:

radiation detection;

detection of infra-red radiation within the 3–30 $\mu$m range particularly in the 3–5 $\mu$m and 8–12 $\mu$m atmospheric transmission windows;

thermal imagery.

DETAILED DESCRIPTION OF EMBODIMENTS

Figure 1A:
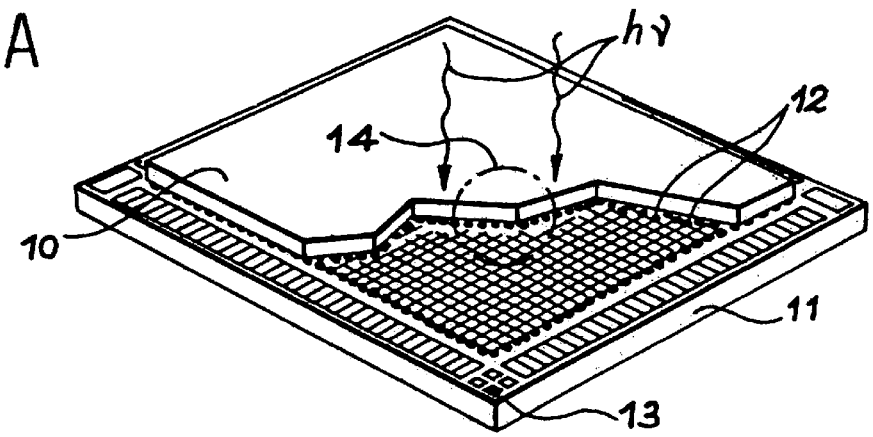
FIGS. 1A and 1B illustrate a schematic view of a two-dimensional infra-red radiation detector according to prior art hybridized on its read circuit, and a magnification of a pixel showing a section through a detector element, respectively.
Figure 1B:
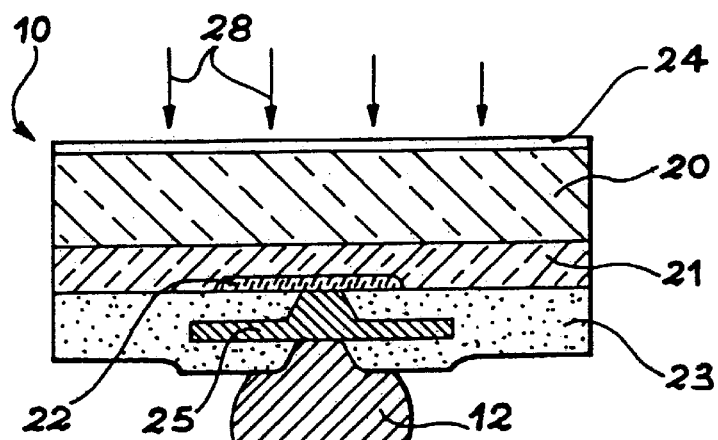
Figure 1B:
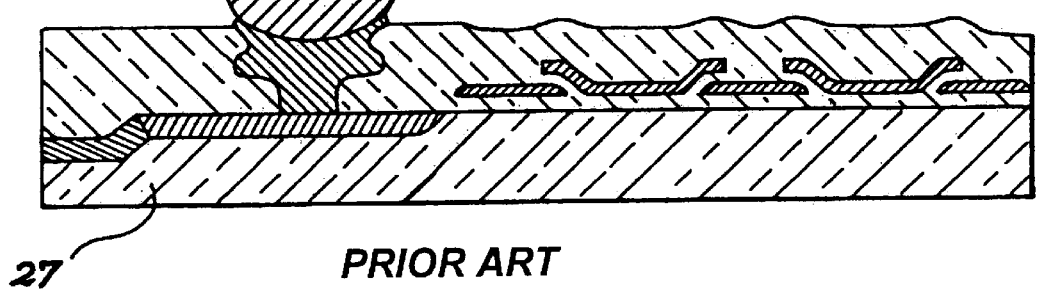
Figure 2:
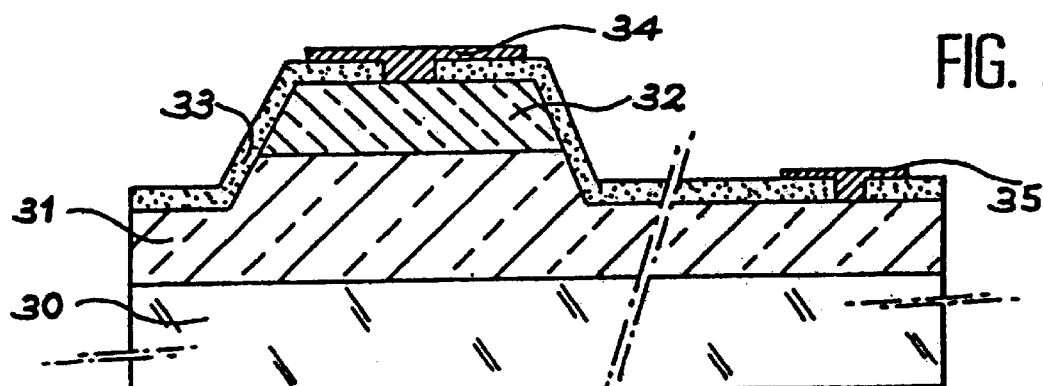
FIG. 2 illustrates a schematic sectional view of a "P on N" hetero-junction detector according to prior art.
Figure 3:
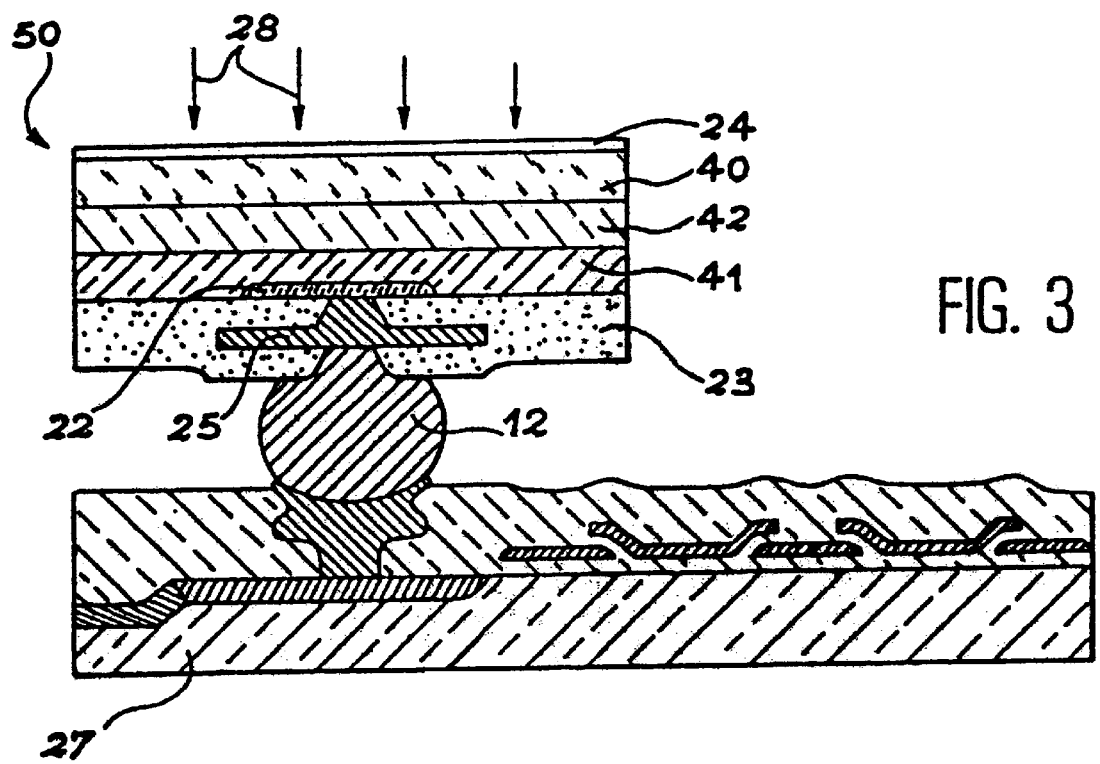
FIG. 3 illustrates a multi-layer stack used in the detector according to the invention.

FIG. 3 shows a two-dimensional infra-red radiation detecting chip 50 having a CdZnTe substrate 40, a CdHgTe layer 41, an N/P diode 22 formed in this layer 41, a passivation layer 23, an anti-reflection layer 24, a contact 25, an indium micro-ball 12, a silicon circuit 27 and received infra-red radiation 28.

The invention consists of inserting an optically and electrically transparent layer of $Cd_yHg_{1-y}Te$ 42 between the CdZnTe substrate 40 and the active layer of $Cd_xHg_{1-x}Te$ 41 of the detector 50. This layer 42 being a wide gap (or prohibited band width) layer and the active layer 41 of $Cd_xHg_{1-x}Te$ being a narrow gap layer.

This type of structure comprises a layer 42 of $Cd_yHg_{1-y}Te$ deposited on a $Cd_{1-z}Zn_zTe$ substrate 40 by any epitaxy technique, this layer itself being covered by the active layer 41 of $Cd_xHg_{1-x}Te$ made by any epitaxy technique, preferably the same that used for the $Cd_yHg_{1-y}Te$ layer (but this is not necessary). FIG. 3 illustrates the metallurgic stack thus made.

Preferably, the hetero-junction formed by putting CdHgTe materials with different compositions together has sufficient progressiveness to avoid the presence of a potential barrier opposing the passage of holes from the $Cd_yHg_{1-y}Te$ layer to the $Cd_xHg_{1-x}Te$ layer. This progressiveness may be formed during the epitaxial growth or by post-growth thermal annealing.

The composition of the $Cd_yHg_{1-y}Te$ layer 42 is such that the layer is transparent to the wave lengths that are to be detected; $x+\epsilon<y<1$, where $\epsilon>0$ and x is the composition of the $Cd_xHg_{1-x}Te$ alloy that makes up the active layer. More precisely, $x_{max}<y$ is chosen where $x_{max}$ is the composition of the alloy that has a gap equal to $hc/q\lambda_{min}$ (h=Planck's constant, c=speed of light, q=electron charge, $\lambda_{min}$= minimum wave length to be detected), the maximum wave length to be detected being defined by the gap in the $Cd_xHg_{1-x}Te$ layer 42. Furthermore, y is preferably chosen to be less than $x_{max}+0.1$ in order to maintain an excellent mesh match between the $Cd_{1-z}Zn_zTe$ substrate 40, the $Cd_yHg_{1-y}Te$ layer 42 and the rest of the structure (optically active area).

The thickness of the layer 42 of $Cd_yHg_{1-y}Te$ is typically between 10 and 30 $\mu$m (however other thicknesses are possible). In a first variant of the invention, this layer 42 is simply doped to differ from stoichiometry. In a second variant, this layer 42 is extrinsically P type doped with an impurity. Preferably, an impurity that diffuses little in CdHgTe, for example As or Sb, is used. The P doping of CdHgTe with this type of impurity has been used in the past, for example in documents reference [4], [5], and [6].

The access resistance to the pixels in a 2D mosaic from a substrate contact located at the edge of the mosaic is considerably reduced by addition of this layer 42; depending on the thickness of this layer and its doping level (typically between $10^{16}$ and $10^{17}$ cm$^{-3}$, firstly to provide a low resistance per unit area for this layer, and secondly to prevent significant absorption of the radiation to be detected by free carriers in the layer), the access resistance to pixels in a two-dimensional mosaic from a substrate contact located at the edge of the mosaic can be reduced by a reduction factor of between 2 and 10 or even more.

The $Cd_yHg_{1-y}Te$ 42 layer that is deposited does not influence the electro-optical characteristics of elementary detectors. This layer is transparent to the wave lengths to be detected and it is electrically more neutral; the difference in composition y–x that can typically be chosen between 0.1 and $x_{max}-x+0.1$ ensures that the contribution of the $Cd_yHg_{1-y}Te$ layer 42 to the dark current of the detector at its operating temperature, is negligible.

As mentioned above, the metallurgical stack shown in FIG. 3 may be made by any epitaxy technique. However, as a non-restrictive example, it would be possible to use epitaxy in the liquid phase or epitaxy by molecular jets that have already demonstrated their usefulness in growing multi-layer stacks even more complex than those required here, as described for example in documents reference [6] and [7]. The technological process for making N/P detection junctions on these two-layer structures, described in documents reference [1] and [2], can then be used to obtain the devices.

This concept of reducing the series resistance in a two-dimensional detection component using a common contact, by adding an optically transparent wide gap (and electrically transparent since wider gap) layer, according to the invention, is applicable to any detection structure (possibly based on other semiconductors such as CdHgTe alloys, or based on detection elements other than P/N diodes) that may or may not be hybridized.

An example of an industrial application of the detector according to the invention is thermal imagery cameras based on CdHgTe.

REFERENCES

[1] "HgCdTe Infrared Diode Arrays" by G. L. Destefanis (Semicond. Sci. Technol., 6, 1991, pages 88–92)

[2] "Hybrid 256×256 LWIR FPA Using MBE Grown HgCdTe On GaAs" by A. Kawahara et Al. (Proc. SPIE, vol. 2552, Jul. 9–13, 1995, San Diego, pages 411–420)

[3] "Large Improvement In HgCdTe Photovoltaic Detector Performance At LETI" by G. Destefanis, J. P. chamonal (J. of Electron. Mater., Vol. 22, No.8, 1993, pages 1027–1032)

[4] "HgCdTe MBE Technology: A Focus On Chemical Doping" by O. K. Wu (Mat. Res. Soc. Symp. Proc., Vol. 302, 1993, pages 423–431)

[5] "Controlled p-Type Sb Doping In LPE Grown $Hg_{1-x}Cd_xTe$ Epilayers" by T.C. harman (J. of Electron Mater., Vol 22, No.9, 1993, pages 1165–1172)

[6] "Hg-Rich Liquid Phase Epitaxy of $Hg_{1-x}Cd_xTe$" by M. H. Kalisher et Al. (Prog. Crystal Growth and Charact., Vol. 29, 1994, pages 41–83)

[7] "Low Threshold Injection laser in HgCdTe" by P. Bouchut et Al. (J. Electron. Mater., vol. 22, No.8, 1993, pages 1061–1065).

What is claimed is:

1. Two-dimensional photonic radiation detector based on a technique of hybridizing a detection chip onto a read chip through a micro-balls network making the electrical and mechanical inter-connection between two chips, the detection chip being composed of a two-dimensional structure of ixj pixels, an active layer being epitaxed onto a substrate, each elementary photosensitive component consisting of an N/P or P/N diode formed in the active layer, the contact point on the N or P area being made at each pixel, the contact point on the other P or N area being common to all diodes, comprising a wide gap optically and electrically transparent intermediate layer located between the active layer and the substrate.

2. Detector according to claim 1, in which the active layer is a layer of $Cd_xHg_{1-x}Te$, where $0 \leq x \leq 1$, in which the substrate is a layer of $Cd_{1-z}Zn_zTe$, where $0 \leq z \leq 1$ and in which the intermediate layer is a layer of $Cd_yHg_{1-y}Te$ transparent for the wave length to be detected, such that $x+\epsilon<y<1$, where $\epsilon>0$, where x is the composition of the alloy that makes up the active layer.

3. Detector according to claim 2, in which $x_{max}<y$, where $x_{max}$ would be the composition of a CdHgTe layer with a gap equal to $hc/q\lambda_{min}$ (h=Planck's constant, c=speed of light, q=electron charge, $\lambda_{min}$=minimum wave length to be detected), the maximum wave length to be detected being defined by the gap in the active layer.

4. Detector according to claim 3, in which y is less than $x_{max}+0.1$ in order to maintain an excellent mesh match between the substrate, the intermediate layer and the rest of the structure.

5. Detector according to claim 1, in which the thickness of the intermediate layer is between 10 and 30 $\mu m$.

6. Detector according to claim 5, in which the intermediate layer is doped to differ from stoichiometry.

7. Detector according to claim 5, in which the intermediate layer is extrinsically P type doped with an impurity.

8. Detector according to claim 7, in which this impurity diffuses little in CdHgTe.

9. Detector according to claim 8, in which this impurity is of the As or Sb type.

* * * * *